United States Patent
Chern et al.

(10) Patent No.: US 10,284,195 B2
(45) Date of Patent: *May 7, 2019

(54) LOW STATIC CURRENT SEMICONDUCTOR DEVICE

(71) Applicant: Taiwan Semiconductor Manufacturing Company Limited, Hsinchu (TW)

(72) Inventors: Chan-Hong Chern, Palo Alto, CA (US); Chu Fu Chen, Hsinchu County (TW); Chun Lin Tsai, Hsinchu (TW); Mark Chen, Hsinchu County (TW); King-Yuen Wong, Tuen Mun (HK); Ming-Cheng Lin, Hsinchu (TW); Tysh-Bin Lin, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/021,230

(22) Filed: Jun. 28, 2018

(65) Prior Publication Data

US 2018/0316346 A1    Nov. 1, 2018

Related U.S. Application Data

(62) Division of application No. 15/279,468, filed on Sep. 29, 2016, now Pat. No. 10,050,621.

(51) Int. Cl.
*H03K 3/00*     (2006.01)
*H03K 17/687*   (2006.01)
*H02M 3/07*     (2006.01)
*H01L 23/31*    (2006.01)
*H03K 17/06*    (2006.01)

(52) U.S. Cl.
CPC ..... *H03K 17/6877* (2013.01); *H01L 23/3107* (2013.01); *H02M 3/07* (2013.01); *H03K 17/063* (2013.01); *H03K 2217/0036* (2013.01); *H03K 2217/0081* (2013.01)

(58) Field of Classification Search
CPC ............. H03K 17/6877; H03K 17/063; H03K 2217/0081; H03K 2217/0036; H01L 23/3107; H02M 3/07
See application file for complete search history.

(56) References Cited

U.S. PATENT DOCUMENTS

| | | |
|---|---|---|
| 6,060,948 A | 5/2000 | Tarantola et al. |
| 8,207,720 B2 | 6/2012 | Tang et al. |
| 8,581,638 B2 | 11/2013 | Chen et al. |
| 9,571,038 B1 | 2/2017 | van Holland et al. |
| 10,050,621 B2 * | 8/2018 | Chern ................ H03K 17/6877 |
| 2015/0162832 A1 | 6/2015 | Briere |

* cited by examiner

*Primary Examiner* — Kenneth B Wells
(74) *Attorney, Agent, or Firm* — Jones Day

(57) ABSTRACT

Devices, systems, and methods are described herein for a low static current semiconductor device. A semiconductor device includes a power transistor and a driving circuit coupled to and configured to drive the power transistor. The driving circuit includes a first stage having an enhancement-mode high-electron-mobility transistor (HEMT) and a a second stage that is coupled between the first stage and the power transistor and that includes a pair of enhancement-mode HEMTs.

20 Claims, 13 Drawing Sheets

LOW STATIC CURRENT SEMICONDUCTOR DEVICE

PRIORITY CLAIM

The present application is a divisional application of U.S. application Ser. No. 15/279,468, filed Sep. 29, 2016, and issued as U.S. Pat. No. 10,050,621, the contents of which are incorporated by reference herein in its entirety.

BACKGROUND

Field effect transistors (FETs), such as a metal-oxide-semiconductor FET (MOSFET), e.g., a silicon-based MOSFET, and a high-electron-mobility transistor (HEMT), e.g., a GaN-based HEMT, are used in the art and each have their own merits and uses. Typically, HEMTs are in the form of a discrete power transistor and MOSFETs are configured to drive the HEMTs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
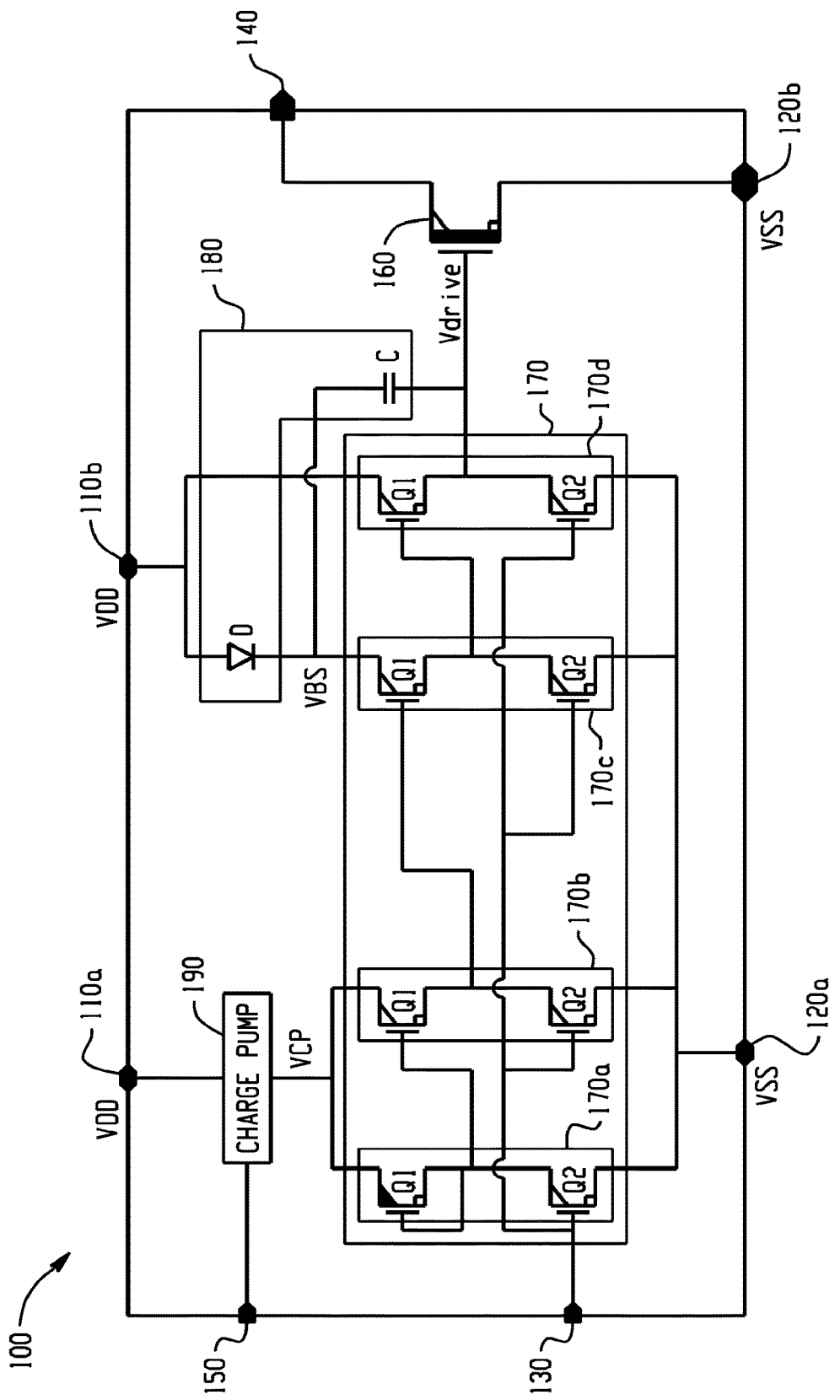
FIG. 1 is a schematic diagram of the first exemplary semiconductor device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides an exemplary semiconductor device that includes a power transistor and a driving circuit configured to drive the power transistor. In one embodiment, the semiconductor device includes a charge pump circuit and a bootstrap circuit. As will be described hereafter, the driving circuit has a static current that is minimal. Further, by virtue of the charge pump circuit and the bootstrap circuit, the power transistor is driven by the driving circuit at a driving voltage substantially equal to a source voltage applied to the semiconductor device.

FIG. 1 is a schematic diagram of the first exemplary semiconductor device 100 in accordance with various embodiments of the present disclosure. The semiconductor device 100, i.e., an integrated circuit (IC), includes source voltage pins 110a, 110b, reference voltage pins 120a, 120b, an input pin 130, an output pin 140, a charge pump enable pin 150, a power transistor 160, a driving circuit 170, a bootstrap circuit 180, and a charge pump circuit 190. In this embodiment, the semiconductor device 100 is implemented using high-electron-mobility transistors (HEMTs), each of which includes first and second source/drain terminals and a gate terminal. In an alternative embodiment, the semiconductor device 100 is implemented using a combination of HEMTs and metal-oxide-semiconductor field-effect transistors (MOSFETs). The HEMT is either an enhancement-mode HEMT that is in an off state at a zero gate-source voltage and that is turned on/activated by pulling the gate terminal thereof to a voltage level higher than a level of a source voltage (VDD), or a depletion-mode HEMT that is in an on state at the zero gate-source voltage and that may have a negative threshold voltage, e.g., −1.0V.

In this embodiment, the semiconductor device 100 further includes a package, which encapsulates the power transistor 160, the driving circuit 170, the bootstrap circuit 180, and the charge pump circuit 190 therein, and into which the pins 110a, 110b, 120a, 120b, 130, 140, 150 extend.

The source voltage pins 110a, 110b are configured to be connected to an external power source, whereby the source voltage (VDD), e.g., 6.0V, is applied thereto. The reference voltage pins 120a, 120b are configured to be connected to the external power source, whereby a reference voltage (VSS), e.g., a ground voltage, is applied thereto. The input pin 130 is configured to be coupled to an external signal source, e.g., a pulse-width modulation (PWM) circuit, whereby an input signal that transitions between a low voltage level, e.g., a level of the reference voltage (VSS), and a high voltage level, e.g., a level of the source voltage, e.g., (VDD), is applied thereto. The output pin 140 is configured to be connected to a load, e.g., an inductive load, a capacitive load, or a combination thereof.

In this embodiment, the power transistor 160 is a III-V compound semiconductor-based, e.g., GaN-based, enhancement-mode HEMT and has a high voltage rating, e.g., between about 40V and about 650V. In an alternative embodiment, the power transistor 160 is a depletion-mode HEMT. In some embodiments, the power transistor 160 may be any compound semiconductor-based, e.g., II-VI or IV-IV compound semiconductor-based, HEMT. As illustrated in FIG. 1, the first and second source/drain terminals of the power transistor 160 are connected to the output pin 140 and the reference voltage pin 120b, respectively.

The driving circuit 170 is configured to drive the power transistor 160 and includes a plurality of stages 170a, 170b, 170c, 170d that each operate as an inverter. In this embodiment, each of the stages 170b, 170c, and 170d includes a pair of enhancement-mode HEMTs (Q1, Q2). The first source/drain terminals of the HEMTs (Q1, Q2) of the stage 170d are connected to each other and to the gate terminal of the power transistor 160. The second source/drain terminal of the HEMT (Q1) of the stage 170d is connected to the source voltage pin 110b. The first source/drain terminals of the HEMTs (Q1, Q2) of the stage 170c are connected to each other and to the gate terminal of the HEMT (Q1) of the stage 170d. The first source/drain terminals of the HEMTs (Q1, Q2) of the stage 170b are connected to each other and to the gate terminal of the HEMT (Q1) of the stage 170c.

The stage 170a includes a depletion-mode HEMT (Q1) and an enhancement-mode HEMT (Q2). The first source/drain terminal and the gate terminal of the HEMT (Q1) and the first source/drain terminal of the HEMT (Q2) of the stage 170a are connected to each other and to the gate terminal of the HEMT (Q1) of the stage 170b.

The second source/drain terminals of the HEMTs (Q2) of the stages 170a, 170b, 170c, 170d are connected to each other and to the reference voltage pin 120a. The gate terminals of the HEMTs (Q2) of the stages 170a, 170b, 170c, 170d are connected to each other and to the input pin 130.

The bootstrap circuit 180 is configured to generate a bootstrap voltage (VBS) greater than the source voltage (VDD) and includes a diode (D) and a capacitor (C). In this embodiment, the diode (D) is a two-terminal diode, i.e., has anode and cathode terminals, and is connected between the source voltage pin 110b and the second source/drain terminal of the HEMT (Q1) of the stage 170c. The capacitor (C) is connected between the second source/drain terminal of the HEMT (Q1) of the stage 170c and the first source/drain terminals of the HEMTs (Q1, Q2) of the stage 170d. It will be appreciated that, after reading this disclosure, the bootstrap circuit 180 may be of any suitable construction so long as it achieves the intended purpose described herein.

The charge pump circuit 190 includes an input terminal connected to the source voltage pin 110a and an output terminal and is configured to generate a charge pump voltage (VCP) at the output terminal thereof greater than the source voltage (VDD) at the input terminal thereof. The second source/drain terminals of the HEMTs (Q1, Q1) of the stages 170a, 170b are connected to each other and to the output terminal of the charge pump circuit 190.

It should be understood that each of the HEMTs (Q1, Q2), aside from the first and second source/drain terminals and the gate terminals, further includes a bulk. In an embodiment, the bulks of the HEMTs (Q1, Q2) are connected to each other and to the reference voltage pin 120a/120b. In another embodiment, the bulks of the HEMTs (Q1, Q2) are connected to each other and to the source voltage pin 110a/110b.

In operation, when the input signal at the input pin 130 transitions from the low voltage level, e.g., 0V, to the high voltage level, e.g., 6.0V, the HEMTs (Q2) of the stages 170a, 170b, 170c, 170d are turned on/activated. As a result, a deactivating voltage, which corresponds to the reference voltage (VSS), appears at the gate terminals of the HEMTs (Q1) of the stages 170a, 170b, 170c, 170d. This turns off/deactivates the HEMTs (Q1) of the stages 170b, 170c, 170d. This, in turn, charges the capacitor (C). At this time, the HEMT (Q1) of the stage 170a is activated and operates as a resistor, the charge pump circuit 190 generates the charge pump voltage (VCP) at the output terminal thereof, and thus a static current flows through the stage 170a. It is noted that, by virtue of the stages 170b, 170c, 170d between the stage 170a and the power transistor 160, the driving circuit 170 of the present disclosure has a minimal static current.

In a subsequent operation, when the input signal at the input pin 130 transitions from the high voltage level back to the low voltage level, the HEMTs (Q2) of the stages 170a, 170b, 170c, 170d are deactivated. At this time, the HEMT (Q1) of the stage 170a is activated and operates as a resistor, the charge pump circuit 190 generates the charge pump voltage (VCP), e.g., 16.0V, at the output terminal thereof, and an activating voltage that corresponds to the charge pump voltage (VCP) appears at the gate terminal of the HEMT (Q1) of the stage 170b. By virtue of the charge pump circuit 190, an activating voltage, a level of which is high enough to activate the HEMT (Q1) of the stage 170c, e.g., 12.5V, appears at the gate terminal of the HEMT (Q1) of the stage 170c. By virtue of the bootstrap circuit 180, an activating voltage, a level of which is high enough to activate the HEMT (Q1) of the stage 170d, e.g., 7.5V, appears at the gate terminal of the HEMT (Q1) of the stage 170d. As a result, a driving voltage (Vdrive) substantially equal to the source voltage (VDD) appears at the gate terminal of the power transistor 160.

In an alternative embodiment, the semiconductor device 100 is dispensed with the power transistor 160, the reference voltage pin 120b, and the output pin 140. In such an alternative embodiment, the semiconductor device 100 further includes a power transistor pin (not shown) that extends into the package and that is connected to the first source/drain terminals of the HEMTs (Q1, Q2) of the stage 170d.

Figure 2:
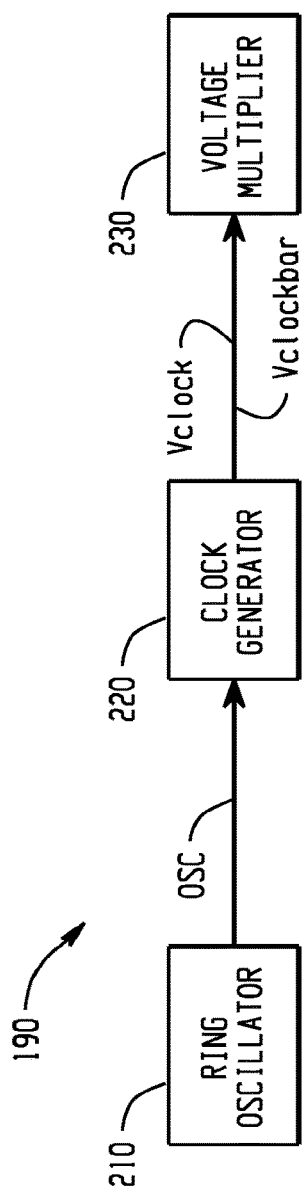
FIG. 2 is a schematic diagram of an exemplary charge pump circuit of the semiconductor device in accordance with various embodiments of the present disclosure.
Figure 3:
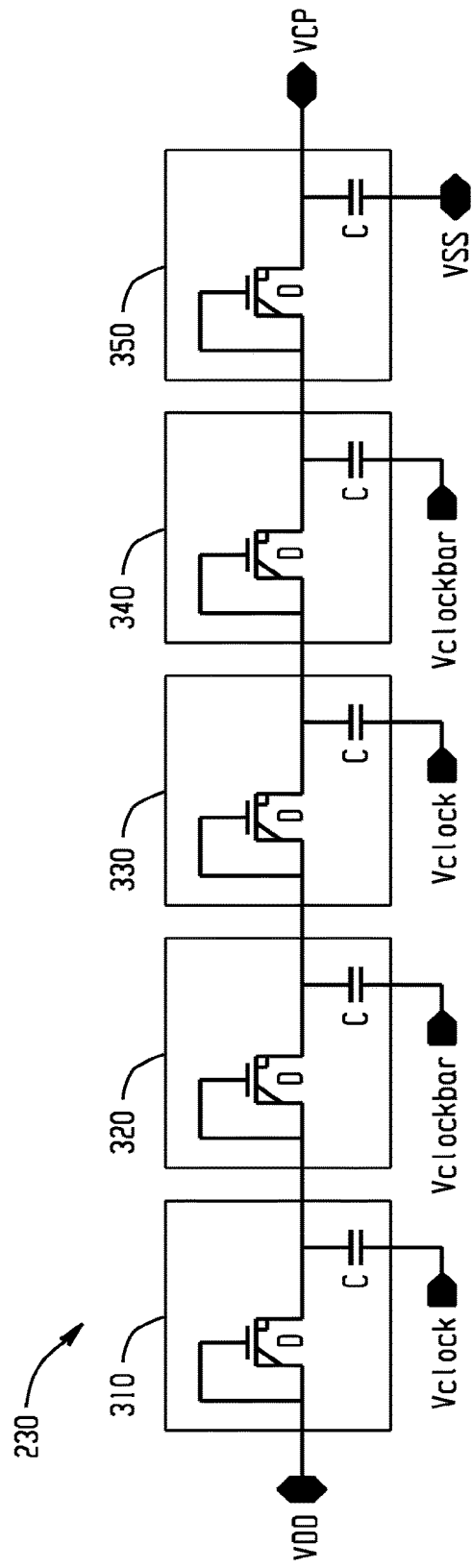
FIG. 3 is a schematic diagram of an exemplary voltage multiplier of the charge pump circuit in accordance with various embodiments of the present disclosure.

FIG. 2 is a schematic diagram of the charge pump circuit 190 in accordance with various embodiments of the present disclosure. The charge pump circuit 190 includes a ring oscillator 210, a clock generator 220, and a voltage multiplier 230. FIG. 3 is a schematic diagram of the voltage multiplier 230 in accordance with various embodiments of the present disclosure. As illustrated in FIG. 3, the voltage multiplier 230 is between the input and output terminals of the charge pump circuit 190, is a Dickson voltage multiplier/charge pump in this embodiment, and includes stages 310, 320, 330, 340, 350, each of which includes a diode (D) and a capacitor (C). In this embodiment, the diode (D) of each of the stages 310, 320, 330, 340, 350 is a diode-connected enhancement-mode HEMT. In some embodiments, the diode (D) of each of the stages 310, 320, 330, 340, 350 is a two-terminal diode. In other embodiments, the diode (D) of each of the stages 310, 320, 330, 340, 350 is a diode-connected MOSFET.

Figure 4:
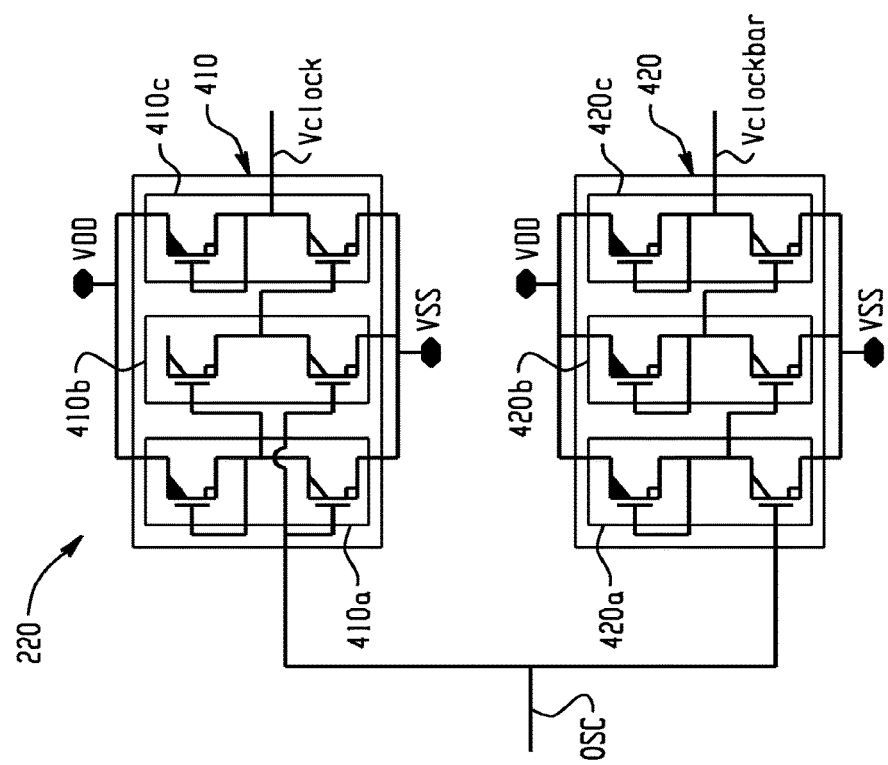
FIG. 4 is a schematic diagram of an exemplary clock generator of the charge pump circuit in accordance with various embodiments of the present disclosure.

FIG. 4 is a schematic diagram of the clock generator 220 in accordance with various embodiments of the present disclosure. As illustrated in FIG. 4, the clock generator 220 includes a true module 410 and a complement module 420. The true module 410 has input and output terminals, is configured to generate a true clock signal (Vclock) at the output terminal thereof, and includes stages 410a, 410b, 410c between the input and output terminals thereof. The complement module 420 has input and output terminals, is configured to generate at the output terminal thereof a complement clock signal (Vclockbar) that is a complement of the true clock signal (Vclock), and includes stages 420a, 420b, 420c between the input and output terminals thereof. Each of the stages 410a, 410b, 410c of the true module 410 and the stages 420a, 420b, 420c of the complement module 420 includes a pair of HEMTs, one of which is a depletion-mode HEMT and the other of which is an enhancement-mode HEMT. The stage 410b of the true module 410 includes a pair of enhancement-mode HEMT.

It is noted that, since the true and complement modules 410, 420 have the same number of stages, i.e., three in this embodiment, the true clock signal (Vclock)/complement clock signal (Vclockbar) does not lead/lag the complement clock signal (Vclockbar)/true clock signal (Vclock). As such, the true clock signal (Vclock) and the complement clock signal (Vclockbar) are substantially 180° out-of-phase with each other.

Although the clock generator 220 is exemplified such that the true and complement modules 410, 420 thereof includes three stages, it will be appreciated that the true and complement modules 410, 420 may include any number of stages.

With further reference to FIG. 3, the capacitors (C) of the stages 310 and 330 are connected to each other and to the output terminal of the true module 410, whereas the capacitors (C) of the stages 320 and 340 are connected to each other and to the output terminal of the complement module 420.

Figure 5:
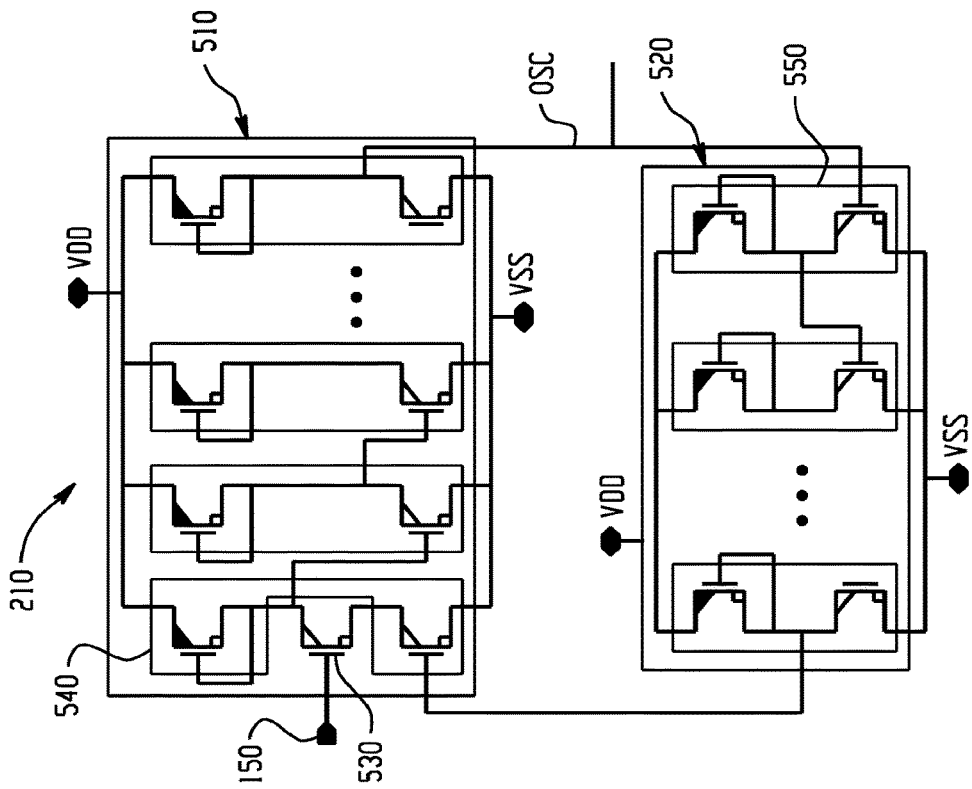
FIG. 5 is a schematic diagram of an exemplary ring oscillator of the charge pump circuit in accordance with various embodiments of the present disclosure.

FIG. 5 is a schematic circuit diagram illustrating the ring oscillator 210 in accordance with various embodiments of the present disclosure. As illustrated in FIG. 5, the ring oscillator 210 includes a feedforward oscillating module 510, a feedback oscillating module 520, and an enabling module 530. The feedforward oscillating module 510 has input and output terminals, is configured/operable to generate an oscillation signal (OSC) at the output terminal thereof, and includes stages (for simplicity purpose, only one of the stages of the feedforward oscillating module 510 is labeled as 540) between the input and output terminals thereof. The feedback oscillating module 520 has input and output terminals connected to the output and input terminals of the feedforward oscillating module 510, respectively, is configured to route/feed the oscillation signal (OSC) at the output terminal of the feedforward oscillating module 510 back to the input terminal of the feedforward oscillation module 510, and includes stages (for simplicity purpose, only one of the stages of the feedback oscillating module 520 is labeled as 550). Each of the stages of the modules 510, 520 includes a pair of HEMTs, one of which is a depletion-mode HEMT and the other of which is an enhancement-mode HEMT.

The enabling module 530 is connected between the charge pump enable pin 150 and the stage 540, is configured to enable operation of the feedforward oscillating module 510, and includes an enhancement-mode HEMT.

With further reference to FIG. 4, the input terminals of the true and complement modules 410, 420 are connected to each other and to the output terminal of the feedforward oscillating module 510.

In operation, when a voltage at the gate terminal of the HEMT of the enabling module 530 transitions from the low voltage level to the high voltage level, the feedforward oscillating module 510 generates the oscillation signal (OSC) at the output terminal thereof. As a result, the true and complement modules 410, 420 generate the true and complement clock signals (Vclock, Vclockbar) at the output terminals thereof, respectively, whereby the voltage multiplier 230 generates the charge pump voltage (VCP) at the output terminal of the charge pump circuit 190.

It will be appreciated that, after reading this disclosure, the charge pump circuit 190 may be of any suitable construction so long as it achieves the intended purpose described herein.

Figure 6:
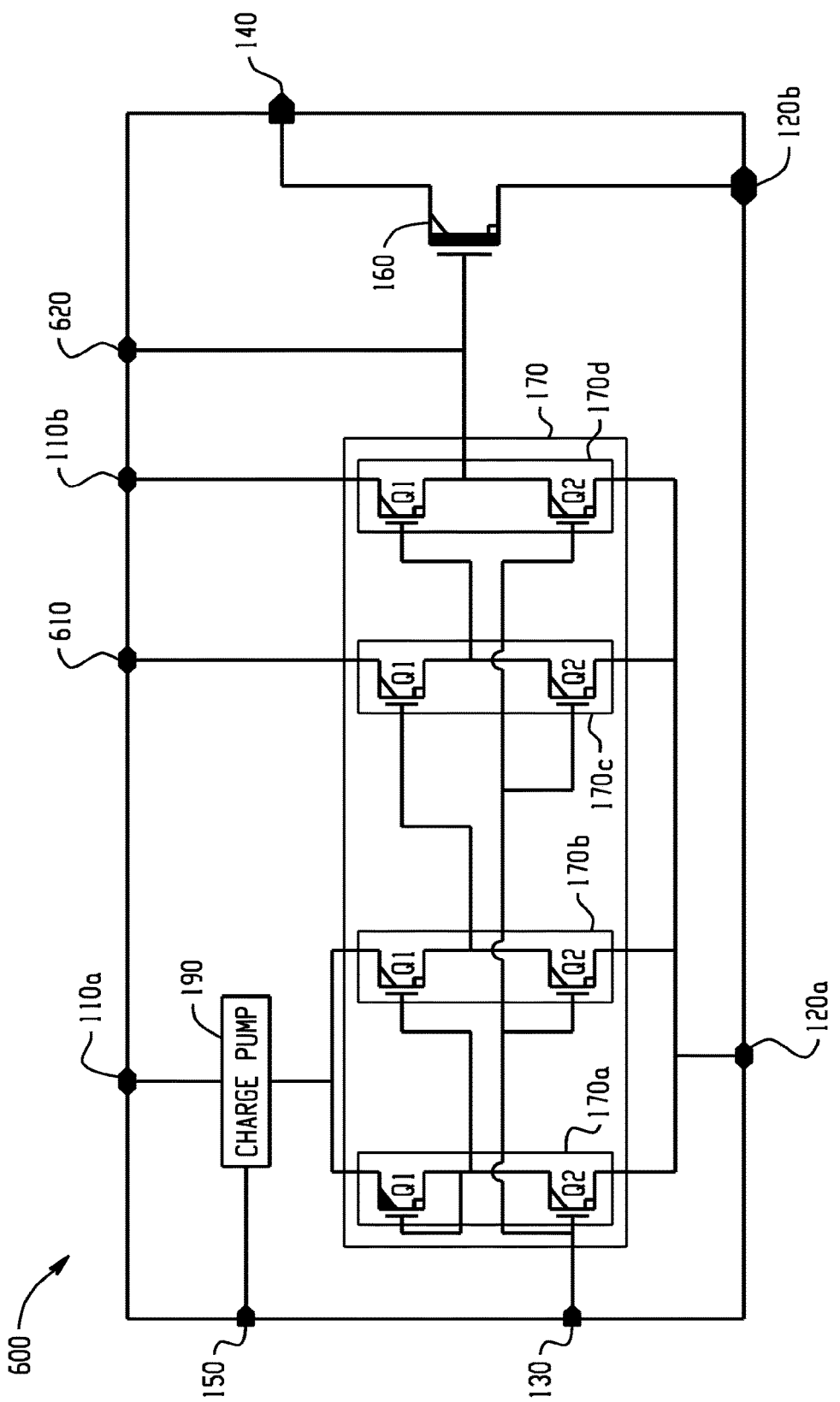
FIG. 6 is a schematic diagram of the second exemplary semiconductor device in accordance with various embodiments of the present disclosure.

FIG. 6 is a schematic diagram of the second exemplary semiconductor device 600 in accordance with various embodiments of the present disclosure. This embodiment differs from the semiconductor device 100 in that the semiconductor device 600 is dispensed with the bootstrap circuit 180. The construction as such reduces manufacturing costs for the semiconductor device 600 and permits the bootstrap circuit 180 to be implemented externally of the semiconductor device 600. The semiconductor device 600 further includes a bootstrap pin 610 that extends into the package and that is connected to the second source/drain terminal of the HEMT (Q1) of the stage 170c and a bootstrap pin 620 that extends into the package and that is connected to the first source/drain terminals of the HEMTs (Q1, Q2) of the stage 170d.

Figure 7:
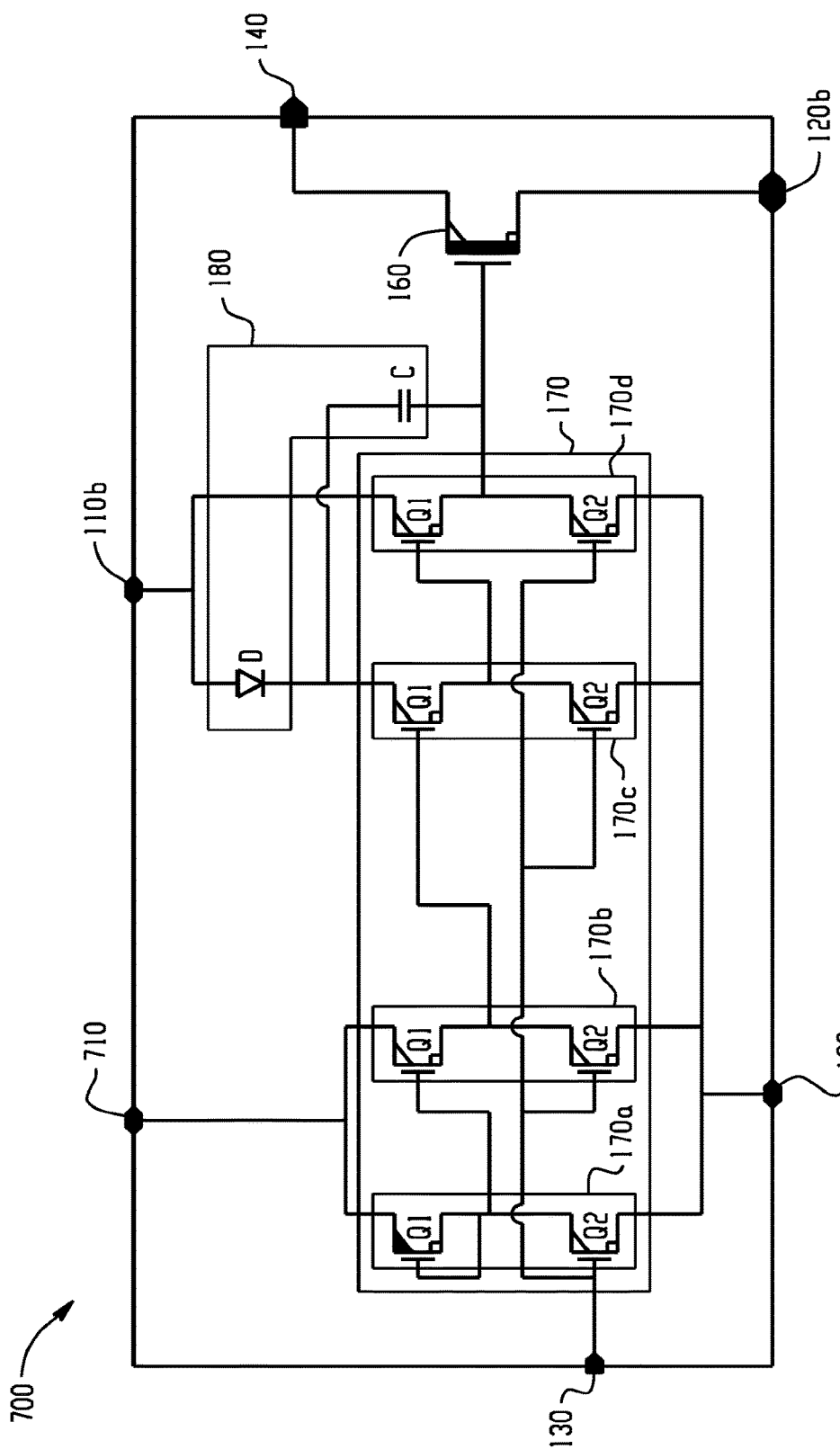
FIG. 7 is a schematic diagram of the third exemplary semiconductor device in accordance with various embodiments of the present disclosure.

FIG. 7 is a schematic diagram of the third exemplary semiconductor device 700 in accordance with various embodiments of the present disclosure. This embodiment differs from the semiconductor device 100 in that the semiconductor device 700 is dispensed with the charge pump circuit 190 and the charge pump enable pin 150. The construction as such reduces manufacturing costs for the semiconductor device 700 and permits the ring oscillator 210, the clock generator 220, and the voltage multiplier 230 of the charge pump circuit 190 to be implemented externally of the semiconductor device 700. The semiconductor device 700 further includes a charge pump pin 710 that extends into the package and that is connected to the second source/drain terminals of the HEMTs (Q1, Q1) of the stages 170a, 170b.

Figure 8:
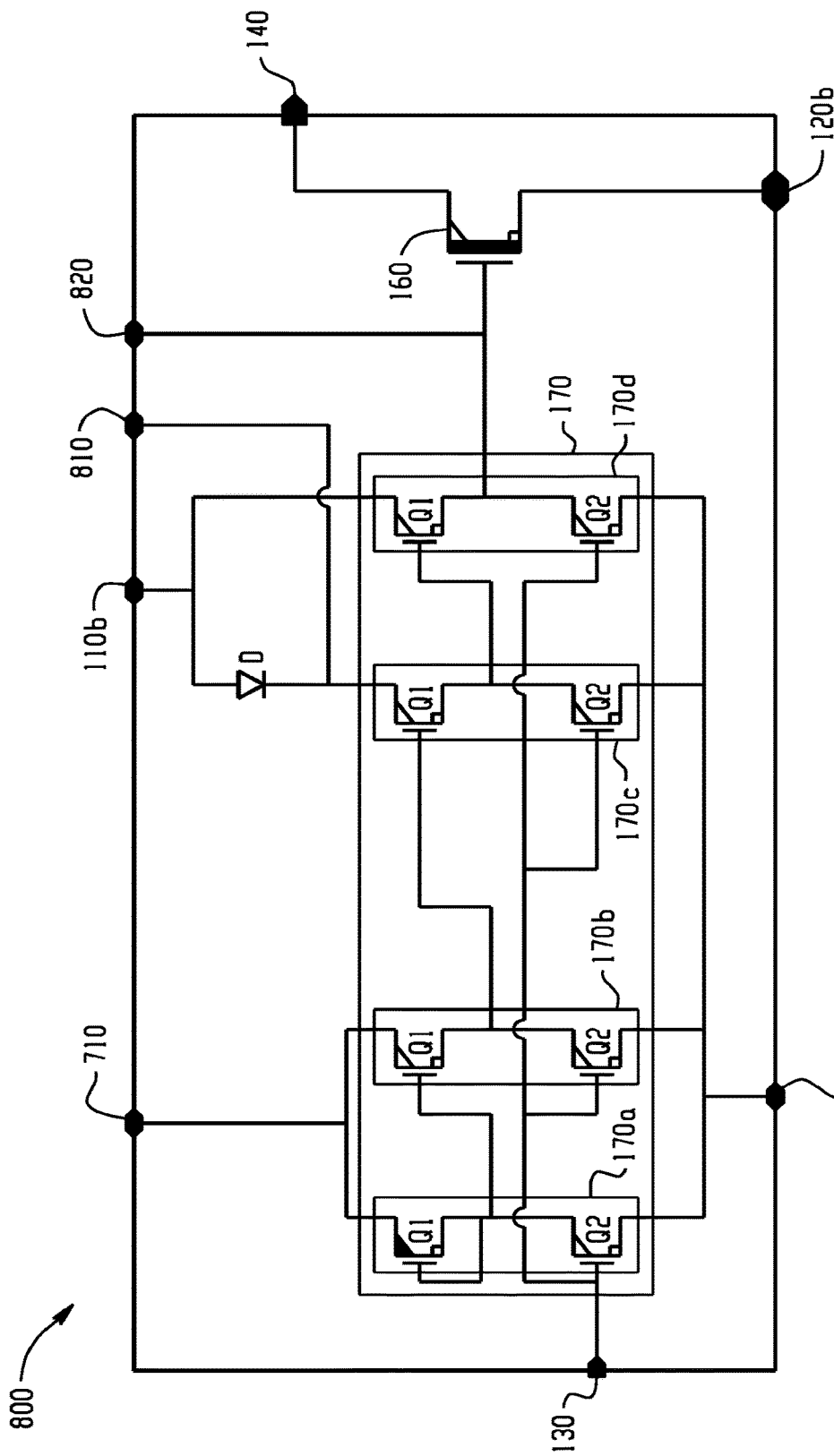
FIG. 8 is a schematic diagram of the fourth exemplary semiconductor device in accordance with various embodiments of the present disclosure.

FIG. 8 is a schematic diagram of the fourth exemplary semiconductor device 800 in accordance with various embodiments of the present disclosure. This embodiment differs from the semiconductor device 700 in that the semiconductor device 800 is further dispensed with at least one of components, e.g., at least one of the diode (D) and the capacitor (C), of the bootstrap circuit 180. The construction as such reduces manufacturing costs for the semiconductor device 800 and permits the diode (D) and/or the capacitor (C) of the bootstrap circuit 180 to be implemented externally of the semiconductor device 800. In an embodiment, as illustrated in FIG. 8, the semiconductor device 800 is dispensed with the capacitor (C) of the bootstrap circuit 180. The semiconductor device 800 further includes a capacitor pin 810 that extends into the package and that is connected to the second source/drain terminal of the HEMT (Q1) of the stage 170*c* and a capacitor pin 820 that extends into the package and that is connected to the first source/drain terminals of the HEMTs (Q1, Q2) of the stage 170*d*. In another embodiment, the semiconductor device 800 is dispensed with the diode (D), instead of the capacitor (C). In such another embodiment, the semiconductor device 800 further includes a diode pin that extends into the package and that is connected to the second source/drain terminal of the HEMT (Q1) of the stage 170*c*.

Figure 9:
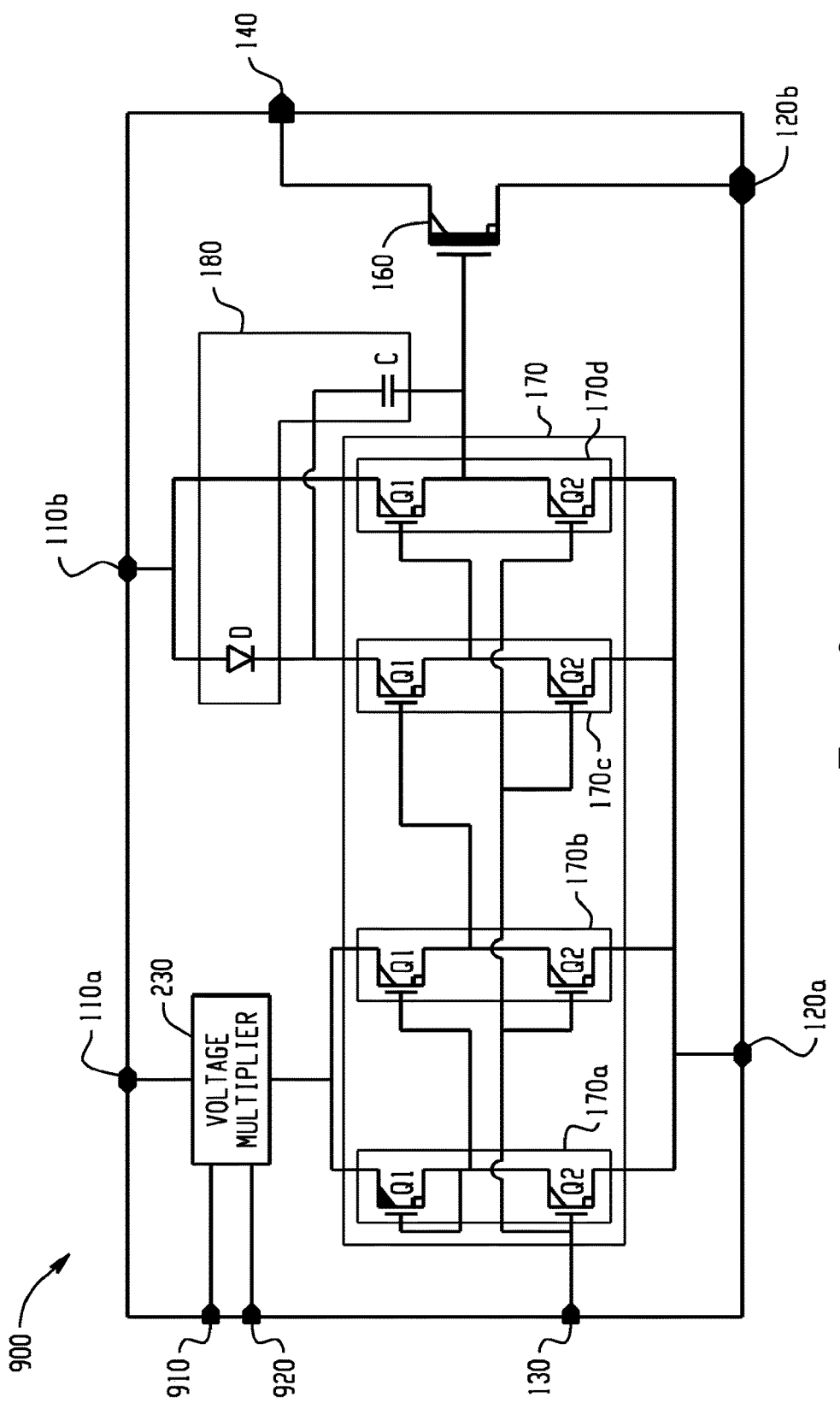
FIG. 9 is a schematic diagram of the fifth exemplary semiconductor device in accordance with various embodiments of the present disclosure.

FIG. 9 is a schematic diagram of the fifth exemplary semiconductor device 900 in accordance with various embodiments of the present disclosure. This embodiment differs from the semiconductor device 100 in that the semiconductor device 900 is dispensed with at least one of components, e.g., at least one of the ring oscillator 210, the clock generator 220, and the voltage multiplier 230, of the charge pump circuit 190. The construction as such reduces manufacturing costs for the semiconductor device 900 and permits the ring oscillator 210, the clock generator 220, and/or the voltage multiplier 230 of the charge pump circuit 190 to be implemented externally of the semiconductor device 900. In this embodiment, the semiconductor device 900 is dispensed with the ring oscillator 210 and the clock generator 220. The semiconductor device 900 further includes a clock generator pin 910 that extends into the package and that is connected to the capacitors (C) of the stages 310 and 330 of the voltage multiplier 230 and a clock generator pin 920 that extends into the package and that is connected to the capacitors (C) of the stages 320 and 340 of the voltage multiplier 230.

Figure 10:
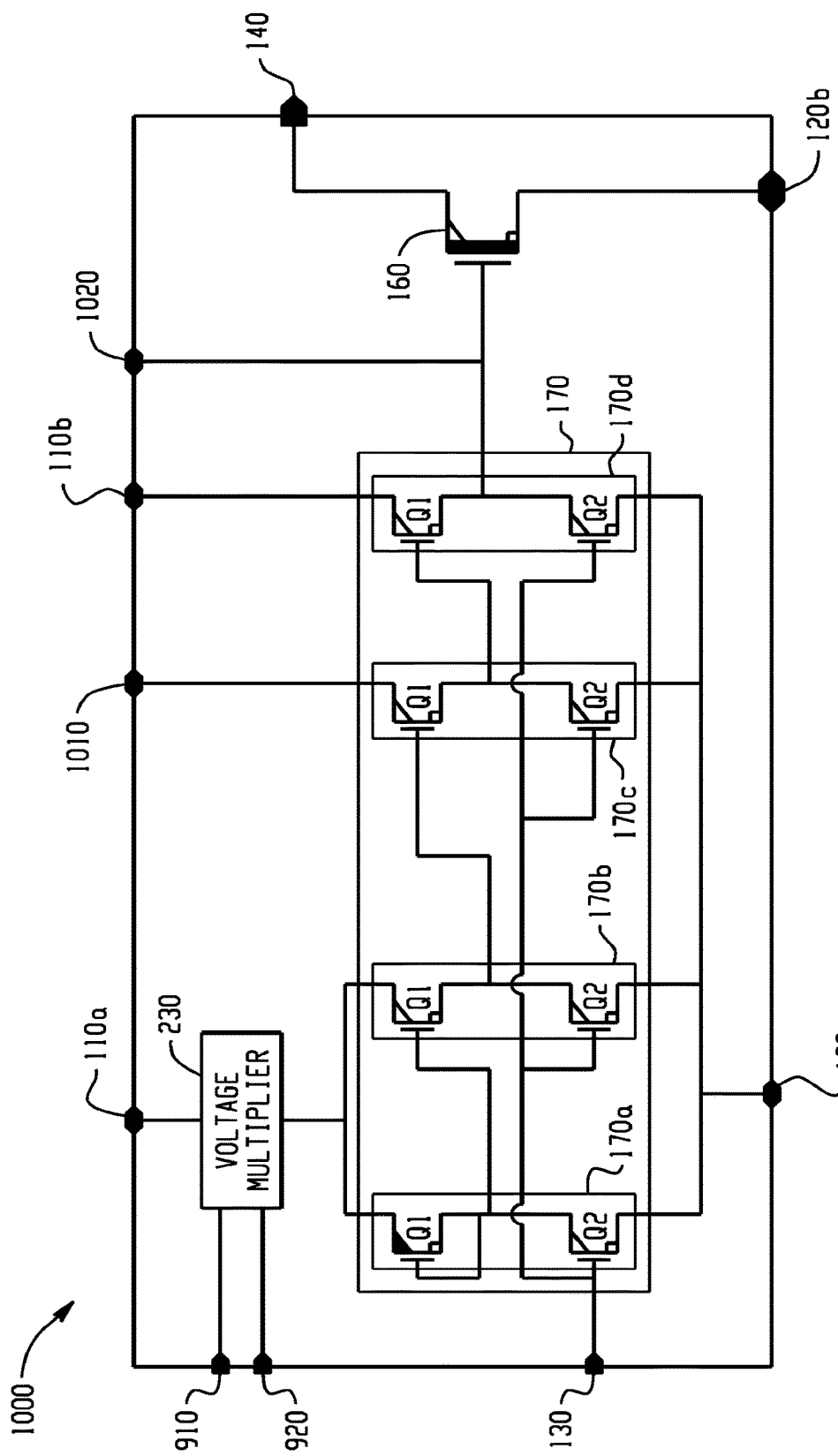
FIG. 10 is a schematic diagram of the sixth exemplary semiconductor device in accordance with various embodiments of the present disclosure.

FIG. 10 is a schematic diagram of the sixth exemplary semiconductor device 1000 in accordance with various embodiments of the present disclosure. This embodiment differs from the semiconductor device 900 in that the semiconductor device 1000 is further dispensed with the bootstrap circuit 180. The construction as such reduces manufacturing costs for the semiconductor device 1000 and permits the bootstrap circuit 180 to be implemented externally of the semiconductor device 1000. The semiconductor device 1000 further includes a bootstrap pin 1010 that extends into the package and that is connected to the second source/drain terminal of the HEMT (Q1) of the stage 170*c* and a bootstrap pin 1020 that extends into the package and that is connected to the first source/drain terminals of the HEMTs (Q1, Q2) of the stage 170*d*.

Figure 11:
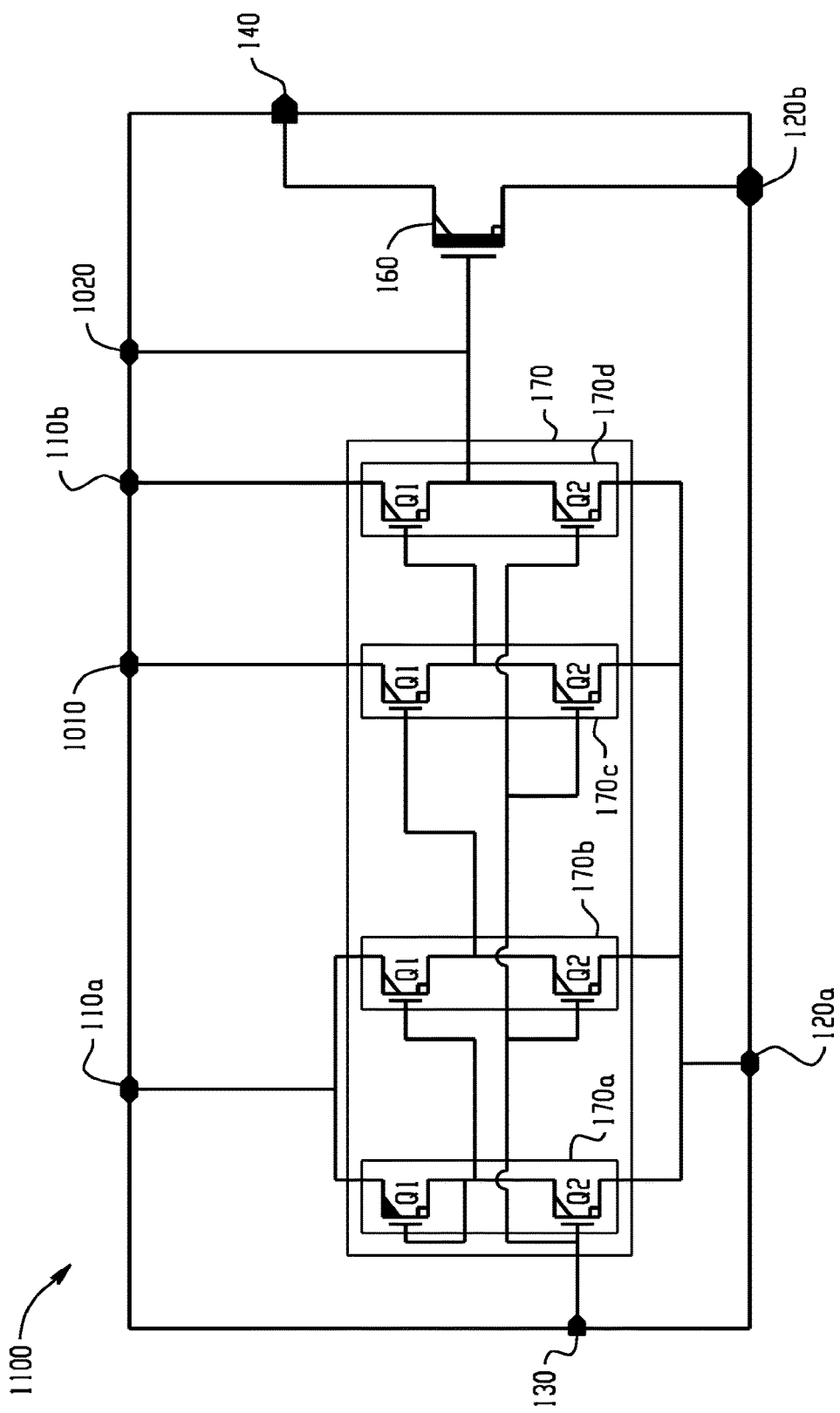
FIG. 11 is a schematic diagram of the seventh exemplary semiconductor device in accordance with various embodiments of the present disclosure.

FIG. 11 is a schematic diagram of the seventh exemplary semiconductor device 1100 in accordance with various embodiments of the present disclosure. This embodiment differs from the semiconductor device 1000 in that the semiconductor device 1100 is further dispensed with the voltage multiplier 230 and the clock generator pins 910, 920. The construction as such reduces manufacturing costs for the semiconductor device 1100 and permits the charge pump circuit 190 to be implemented externally of the semiconductor device 1100. The semiconductor device 1100 further includes a charge pump pin 1110 that extends into the package and that is connected to the second source/drain terminals of the HEMTs (Q1, Q1) of the stages 170*a*, 170*b*.

Figure 12:
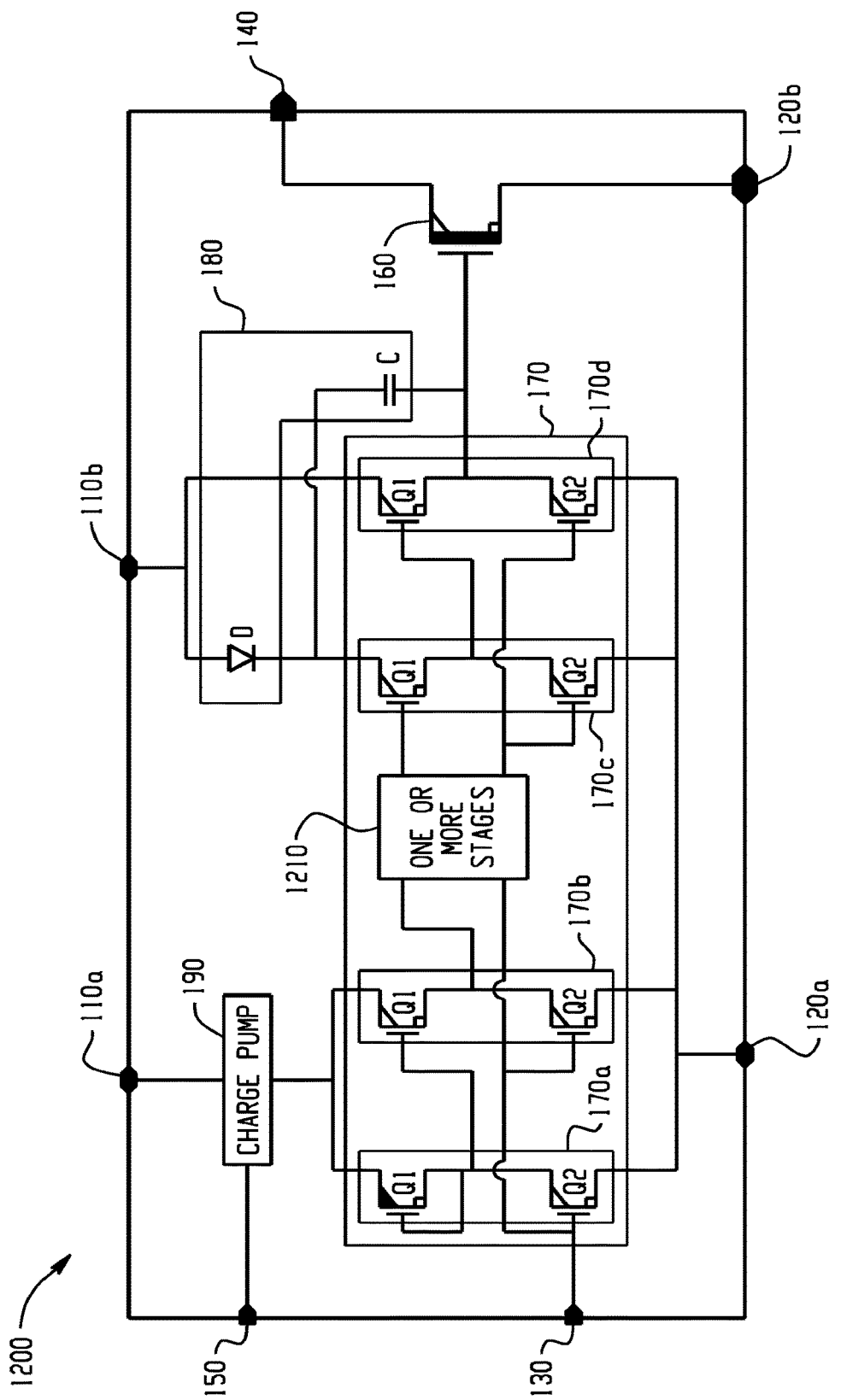
FIG. 12 is a schematic diagram of the eighth exemplary semiconductor device in accordance with various embodiments of the present disclosure.

FIG. 12 is a schematic diagram of the eighth exemplary semiconductor device 1200 in accordance with various embodiments of the present disclosure. This embodiment differs from the semiconductor device 100 in that the driving circuit 170 of the semiconductor device 1200 further includes one or more stages 1210 between the stages 170*b*, 170*c*. The construction as such further lowers the static current of the driving circuit 170 of the semiconductor device 1200.

Figure 13:
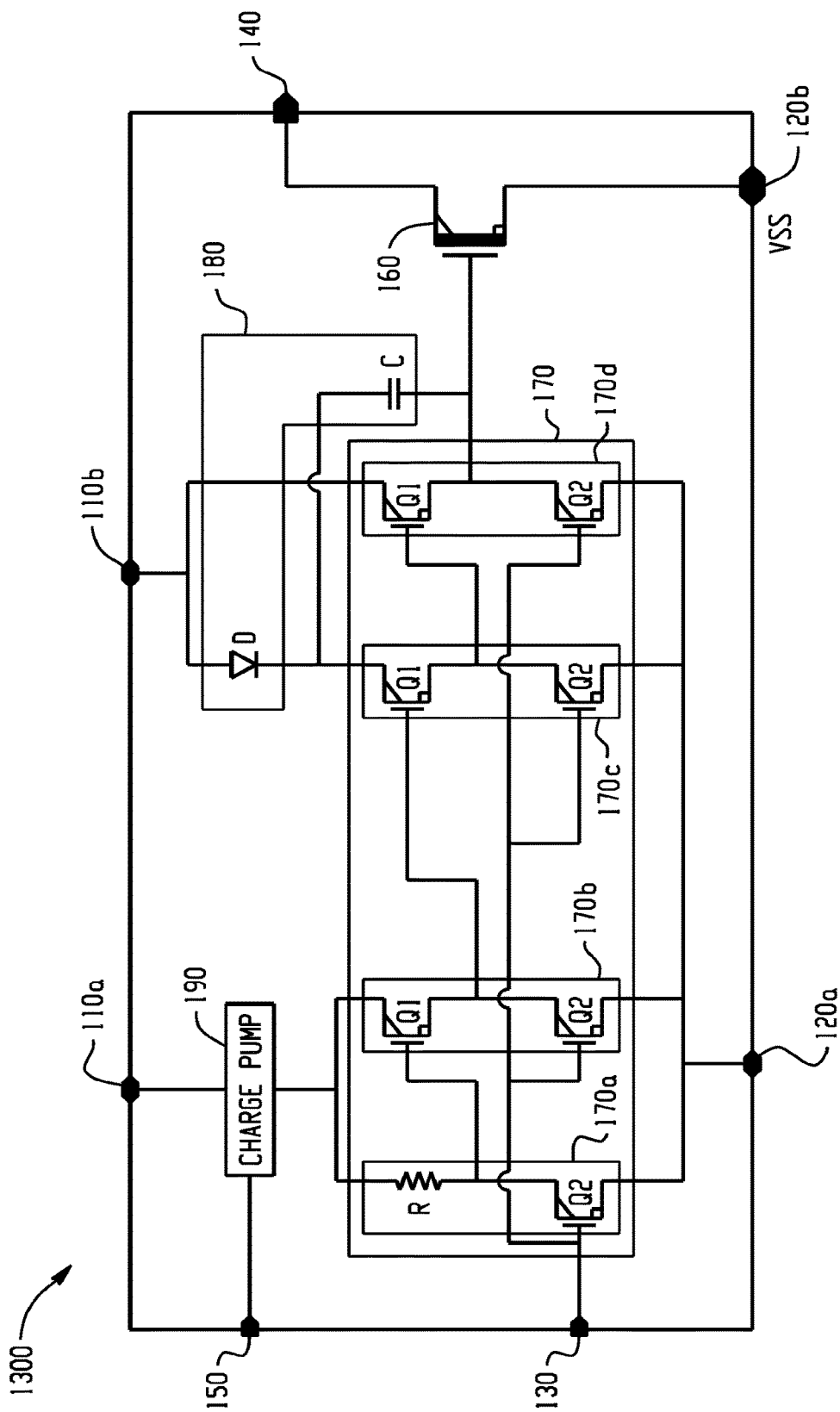
FIG. 13 is a schematic diagram of the ninth exemplary semiconductor device in accordance with various embodiments of the present disclosure.

FIG. 13 is a schematic diagram of the ninth exemplary semiconductor device 1300 in accordance with various embodiments of the present disclosure. This embodiment differs from the semiconductor device 100 in that the stage 170*a* of the driving circuit 170 of the semiconductor device 1300 is dispensed with the HEMT (Q1). The stage 170*a* of the driving circuit 170 of the semiconductor device 1300 further includes a resistor (R) that has a first resistor terminal connected to the output terminal of the charge pump circuit 190 and a second resistor terminal connected to the first source/drain terminal of the HEMT (Q2) of the stage 170*a* and the gate terminal of the HEMT (Q1) of the stage 170*b*.

Figure 14:
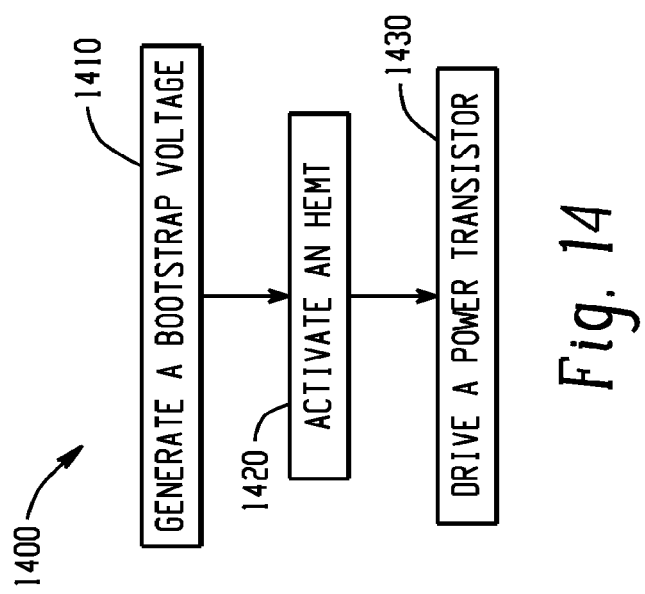
FIG. 14 is a flow chart of the first exemplary method of driving a power transistor in accordance with various embodiments of the present disclosure.

FIG. 14 is a flow chart of the first exemplary method 1400 of driving a power transistor in accordance with various embodiments of the present disclosure. The method 1400 will now be described with further reference to FIG. 1 for ease in understanding, but it is understood that the method is equally applicable to other structures as well. In operation 1410, the bootstrap circuit 180 generates a bootstrap voltage (VBS) at an output terminal thereof greater than the source voltage (VDD) at an input terminal thereof. In operation 1420, the HEMT (Q1) of the stage 170*d* is activated at an activating voltage, e.g., 7.5V, that corresponds to the bootstrap voltage (VBS). In operation 1430, the power transistor 160 is driven at a driving voltage (Vdrive) substantially equal to the source voltage (VDD).

Figure 15:
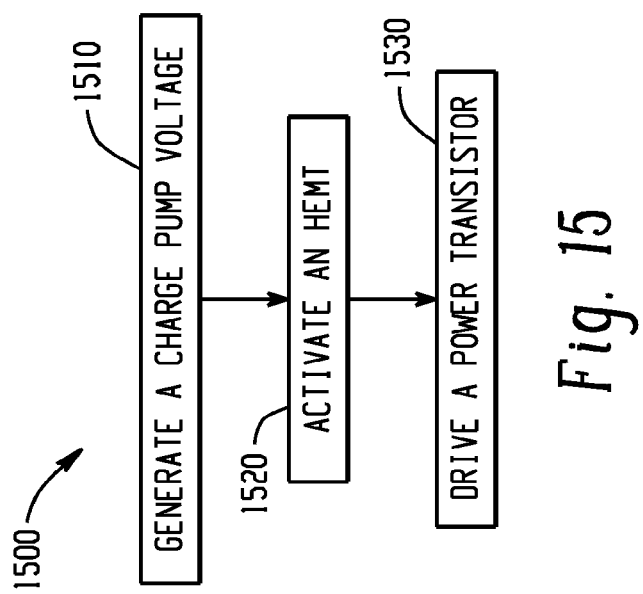
FIG. 15 is a flow chart of the second exemplary method of driving a power transistor in accordance with various embodiments of the present disclosure.

FIG. 15 is a flow chart of the second exemplary method 1500 of driving a power transistor in accordance with various embodiments of the present disclosure. The method 1500 will now be described with further reference to FIG. 1 for ease in understanding, but it is understood that the method is equally applicable to other structures as well. In operation 1510, the charge pump circuit 190 generates a charge pump voltage (VCP) at an output terminal thereof greater than the source voltage (VDD) at an input terminal thereof. In operation 1520, the HEMT (Q1) of the stage 170*c* is activated at an activating voltage, e.g., 12.5V, that corresponds to the charge pump voltage (VCP). In operation 1530, the power transistor 160 is driven at a driving voltage (Vdrive) substantially equal to the source voltage (VDD).

In an exemplary embodiment, a semiconductor device comprises a power transistor and a driving circuit. The driving circuit is coupled to and is configured to drive the power transistor and includes first and second stages. The second stage is coupled between the first stage and the power transistor. Each of the first and second stages includes first and second enhancement-mode high-electron-mobility transistors (HEMTs).

In another exemplary embodiment, a semiconductor device comprises a power transistor and a driving circuit that is coupled to and configured to drive the power transistor and that includes first and second stages. The first stage includes a resistor and an enhancement-mode high-electron-mobility transistor (HEMT). The enhancement-mode HEMT has a source/drain terminal coupled to the resistor.

The second stage is coupled between the first stage and the power transistor and includes a pair of enhancement-mode HEMTs.

In another exemplary embodiment, a method comprises: generating a first voltage at an output terminal of a circuit of a semiconductor device greater than a source voltage at an input terminal of the circuit; activating, at a second voltage that corresponds to the first voltage, an enhancement-mode high-electron mobility transistor (HEMT) of the semiconductor device; and driving, at a driving voltage substantially equal to the source voltage, a power transistor of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising: a power transistor, a driving circuit coupled to and configured to drive the power transistor, and a bootstrap circuit;
   wherein:
   the driving circuit includes a first stage and a second stage;
   the first stage includes an enhancement-mode high-electron-mobility transistor;
   the second stage is coupled between the first stage and the power transistor and includes a pair of enhancement-mode HEMTs;
   the bootstrap circuit has input and output terminals and is configured to generate a bootstrap voltage at the output terminal thereof greater than a source voltage at the input terminal thereof.

2. The semiconductor device of claim 1, wherein the first stage further comprises a resistor, wherein the enhancement-mode HEMT has a source/drain terminal coupled to the resistor.

3. The semiconductor device of claim 1, wherein the first stage further comprises a depletion-mode HEMT coupled to the enhancement-mode HEMT.

4. The semiconductor device of claim 3, wherein the depletion-mode HEMT is a HEMT that is in an on state at a zero gate-source voltage.

5. The semiconductor device of claim 1, wherein the driving circuit further includes a third stage and a fourth stage coupled between the first and second stages, and each of the third stage and the fourth stage includes a pair of enhancement-mode HEMTs.

6. The semiconductor device of claim 5, further comprising:
   a package encapsulating the driving circuit; and
   a pair of capacitor pins extending into the package, wherein an enhancement-mode HEMT of the third stage has a source/drain terminal coupled to one of the capacitor pins and each of the first and second enhancement-mode HEMTs of the second stage has a source/drain terminal coupled to the other of the capacitor pins.

7. The semiconductor device of claim 5, further comprising:
   a package encapsulating the driving circuit; and
   a diode pin extending into the package, wherein an enhancement-mode HEMT of the third stage has a source/drain terminal coupled to the diode pin.

8. The semiconductor device of claim 1, wherein the enhancement-mode HEMT is a HEMT that is in an off state at a zero gate-source voltage.

9. The semiconductor device of claim 1, further comprising:
   a package encapsulating the driving circuit; and
   an input pin extending into the package, wherein the enhancement-mode HEMT of the first stage has a gate terminal coupled to the input pin.

10. The semiconductor device of claim 5, further comprising a charge pump circuit having input and output terminals and configured to generate a charge pump voltage at the output terminal thereof greater than a source voltage at the input terminal thereof, wherein the depletion-mode HEMT has a source/drain terminal coupled to the output terminal of the charge pump circuit.

11. The semiconductor device of claim 5, wherein the first enhancement-mode HEMT of the third stage has a source/drain terminal coupled to the output terminal of the bootstrap circuit.

12. The semiconductor device of claim 11, further comprising:
   a package encapsulating the bootstrap circuit; and
   a source voltage pin extending into the package and coupled to the input terminal of the bootstrap circuit.

13. The semiconductor device of claim 12, wherein the bootstrap circuit includes a diode coupled between the source voltage pin and the source/drain terminal of the first enhancement-mode HEMT of the third stage.

14. The semiconductor device of claim 12, wherein the diode is a diode-connected enhancement-mode HEMT.

15. The semiconductor device of claim 10, wherein the bootstrap circuit includes a capacitor coupled to the source/drain terminal of the first enhancement-mode HEMT of the third stage and each of the first and second enhancement-mode HEMTs of the second stage has a source/drain terminal coupled to the capacitor.

16. The semiconductor device of claim 5, wherein the first enhancement-mode HEMT of the third stage has a source/drain terminal, the semiconductor device further comprising:
   a package encapsulating the driving circuit;
   a source voltage pin extending into the package; and
   a diode coupled between the source voltage pin and the source/drain terminal of the first enhancement-mode HEMT of the third stage.

17. A system comprising:
   a power transistor; and
   a driving circuit coupled to and configured to drive the power transistor, wherein the driving circuit includes a first stage and a second stage coupled between the first stage and a gate terminal of the power transistor, the first stage includes an enhancement-mode high-electron-mobility-transistor (HEMT) that has a source/drain terminal coupled to a resistor, the second stage includes an enhancement-mode HEMT, the output of the first stage is coupled to a gate terminal of the enhancement-mode HEMT of the second stage, and the output of the second stage is coupled to the gate terminal of the power transistor; and a bootstrap circuit having input and output terminals, the bootstrap circuit including a diode having an anode terminal and a cathode terminal, and a capacitor having a first terminal and a second terminal, wherein the anode of the diode is coupled to a source voltage at the input terminal of the bootstrap circuit, and the cathode of the diode is coupled to the first terminal of the capacitor, the second terminal of the capacitor being coupled to both the output of the second stage and the gate terminal of the power transistor.

18. A system comprising:

a power transistor;

a driving circuit coupled to and configured to drive the power transistor, wherein the driving circuit includes a first stage and a second stage coupled between the first stage and a gate terminal of the power transistor, the first stage includes an enhancement-mode high-electron-mobility-transistor (HEMT) that has a source/drain terminal coupled to a resistor, the second stage includes an enhancement-mode HEMT, the output of the first stage is coupled to a gate terminal of the enhancement-mode HEMT of the second stage, and the output of the second stage is coupled to the gate terminal of the power transistor;

a bootstrap circuit having input and output terminals, the bootstrap circuit including a diode having an anode terminal and a cathode terminal, and a capacitor having a first terminal and a second terminal, wherein the anode of the diode is coupled to a source voltage at the input terminal of the bootstrap circuit, and the cathode of the diode is coupled to the first terminal of the capacitor, the second terminal of the capacitor being coupled to both the output of the second stage and the gate terminal of the power transistor; and a charge pump circuit having input and output terminals and configured to generate a charge pump voltage at the output terminal thereof greater than a source voltage at the input terminal thereof, wherein the resistor of the first stage is coupled to the output terminal of the charge pump circuit.

19. The system of claim 18, wherein the driving circuit further includes a third stage that includes first and second enhancement-mode HEMTs, the third stage is coupled between the first and second stages, the output of the first stage is coupled to a gate terminal of the first enhancement-mode HEMT of the third stage, and the output of the third stage is coupled to the gate terminal of the enhancement-mode HEMT of the second stage.

20. The system of claim 18, wherein the driving circuit further includes a fourth stage that is coupled between the first and third stages and that includes a pair of enhancement-mode HEMTs.

* * * * *